United States Patent
Mindru

(10) Patent No.: US 11,645,201 B2
(45) Date of Patent: May 9, 2023

(54) MEMORY ADDRESS GENERATOR

(71) Applicant: NXP USA, Inc., Austin, TX (US)

(72) Inventor: Iancu Ciprian Mindru, Bucharest (RO)

(73) Assignee: NXP USA, Inc., Austin, TX (US)

( * ) Notice: Subject to any disclaimer, the term of this patent is extended or adjusted under 35 U.S.C. 154(b) by 61 days.

(21) Appl. No.: 17/303,122

(22) Filed: May 20, 2021

(65) Prior Publication Data
US 2021/0382820 A1 Dec. 9, 2021

(30) Foreign Application Priority Data

Apr. 16, 2020 (RO) ................ a 2020 00210

(51) Int. Cl.
*G06F 12/06* (2006.01)
(52) U.S. Cl.
CPC ................ *G06F 12/0646* (2013.01)
(58) Field of Classification Search
CPC .................................................. G06F 12/0646
See application file for complete search history.

(56) References Cited

U.S. PATENT DOCUMENTS

| | | | |
|---|---|---|---|
| 5,473,616 A * | 12/1995 | Tsutsui | G11C 29/18 714/743 |
| 5,524,223 A | 6/1996 | Lazaravich et al. | |
| 5,956,757 A * | 9/1999 | Sun | G06F 9/355 712/E9.039 |
| 6,314,507 B1 | 11/2001 | Doyle | |
| 6,647,484 B1 | 11/2003 | Jiang et al. | |
| 8,713,285 B2 | 4/2014 | Rakib et al. | |
| 2007/0083729 A1 | 4/2007 | Moat et al. | |
| 2018/0285254 A1* | 10/2018 | Baum | G06N 3/08 |
| 2018/0341479 A1* | 11/2018 | Temam | G06F 9/34 |
| 2020/0293317 A1* | 9/2020 | Kobayashi | G06F 9/30145 |

FOREIGN PATENT DOCUMENTS

KR 100319770 B1 1/2002
WO PCT-2019/093451 A1 5/2019

* cited by examiner

*Primary Examiner* — Tracy A Warren

(57) ABSTRACT

A memory address generator for generating an address of a location in a memory includes a first address input for receiving a first address having a location in the memory being accessed during a first memory access cycle, and a next address output configured to output a next address comprising a location in the memory to be accessed during a subsequent memory access cycle based on the current address and a memory address increment value The address increment unit includes a counter arrangement and a selector arrangement, wherein each counter of the counter arrangement is configured to provide an output signal at the output indicative of a maximum value being reached and the selector arrangement is configured to provide a candidate memory address increment value based on the output of the counter arrangement as the memory address increment value output by the address increment unit.

18 Claims, 4 Drawing Sheets

MEMORY ADDRESS GENERATOR

CROSS-REFERENCE TO RELATED APPLICATIONS

This application claims the priority under 35 U.S.C. § 119 of Romania application no. A202000210, filed on 16 Apr. 2020, the contents of which are incorporated by reference herein.

FIELD

The present disclosure relates to a memory address generator, a computing system including said memory address generator and methods of generating an address of a location in memory.

SUMMARY

According to a first aspect of the present disclosure there is provided a memory address generator for generating an address of a location in a memory, the memory address generator comprising:
  a first address input for receiving a first address comprising a location in the memory being accessed during a first memory access cycle;
  a next address output configured to output a next address comprising a location in the memory to be accessed during a subsequent memory access cycle based on the current address and a memory address increment value output by an address increment unit;
  wherein the address increment unit comprises:
  a counter arrangement comprising at least a first counter, each of the at least first counter having an input, an output, a count register and a max-count register, wherein each counter is configured to store a count value in the count register that is incremented each time an increment signal is received at the input up to maximum value that is specified in the max-count register, and wherein each counter is configured to, when the count value reaches the maximum value, reset the count register to a start value and provide an output signal at the output indicative of the maximum value being reached; and
  a selector arrangement, wherein the selector arrangement comprises one or more increment registers, including at least a first increment register, each configured to store a candidate memory address increment value and wherein the selector arrangement is configured to select one of the one or more increment registers based on the receipt of the output signal from a corresponding counter of the counter arrangement to provide the candidate memory address increment value stored therein as the memory address increment value output by the address increment unit.

In one or more examples, each counter is configured to, when the count value reaches the maximum value, reset the count register to a start value and provide the output signal at the output indicative of the maximum value being reached as part of the memory access cycle in which the maximum value is reached or as part of the memory access cycle that follows the memory access cycle in which the maximum value is reached.

In one or more embodiments, the counter arrangement may comprise at least two counters, the at least two counters comprising the first counter and at least a second counter, the at least two counters arranged in series in a chain such that the output signal of the first counter of the at least two counters in the chain provides the increment signal to the input of an adjacent counter of the at least two counters in the chain and so on until a final counter of the at least two counters in the chain, and wherein the counter arrangement is configured to provide the output signal of each of the at least two counters to the selector arrangement,
  wherein the selector arrangement may comprise a plurality of increment registers, including the first increment register, each increment register configured to store a candidate memory address increment value and wherein the selector arrangement is configured to select an increment register of the plurality of increment registers based on the receipt of one or more counter output signals from the counter arrangement to provide one of the candidate memory address increment values stored therein as the memory address increment value output by the address increment unit.

In one or more examples, the counter arrangement may be a hardware implemented counter arrangement and may be configurable by virtue of software instructions to set one or both of the count register and the max-count register of one or more of the at least one counter.

In one or more examples, the selector arrangement may be a hardware selector arrangement and may be configurable by virtue of software instructions to set one or more of the increment registers.

In one or more examples, the memory access cycles may comprise cycles to access a particular data structure in the memory and therefore there may be second memory access or memory write cycles between the memory access cycles.

In one or more embodiments, the memory address generator may include a programming unit configured to receive user instructions to set at least one of:
  the maximum value stored in the or each respective max-count register of one or more counters;
  the value stored in each count register of one or more of the at least one counter; and
  the candidate memory address increment value stored in each respective increment register of one or more of the at least one increment register;
to define a custom pattern of locations in the memory to be accessed over a plurality of memory access cycles.

In one or more embodiments the first counter in the chain may be configured to receive a clock signal synchronized with the memory access cycle as its input. In one or more embodiments, the first counter in the chain may be configured to receive an input signal from a processor, wherein the processor is operable to control the memory access cycles.

In one or more embodiments the memory address generator may be provided in combination with said memory, said memory configured to store a multi-dimensional data structure for use in an algebraic operation, wherein values of the multi-dimensional data structure are stored at respective locations in said memory that are identified by said current address and said next address and wherein the memory address generator is configured to receive one or more of the maximum values and/or one or more of the candidate memory address increment values and then generate one or more next addresses for accessing the values of the multi-dimensional data structure to perform said algebraic operation.

In one or more embodiments the programming unit may be configured to reset the count registers of the at least one count register to the start value based on received user generated instructions.

In one or more examples, the memory address generator comprises an adder configured to add the memory address increment value to the first address and, on subsequent memory access cycles, configured to add the memory address increment value to each next address that was output on the immediately preceding memory access cycle. In one or more other examples, logic functions other than an adder may be used to arrive at the next address using the memory address increment value.

In one or more embodiments, for the receipt of a given increment signal by at least the first counter, the selector arrangement may be configured to provide a default memory address increment value as the memory address increment value based on the absence of an output signal from any of the counters of the at least one counter. In one or more examples, the selector arrangement may include a register in which is stored the default memory address increment value. In other examples, the memory address generator may be configured to provide the default memory address increment value to the adder or other logic function in the absence of a memory address increment value from the selector.

In one or more embodiments each of the counters of the two or more counters may correspond to a different one of each of the plurality of increment registers;
  the first counter in the chain of counters may provide an output of a first order and each subsequent counter in the chain of counters provides an output signal of a monotonically increasing order up to the final counter in the chain of counters;
  wherein, during a given access cycle, upon receipt of a plurality of output signals from the two or more counters, the selector arrangement may be configured to provide a memory address increment based on the highest order output signal of the plurality of output signals In one or more embodiments there may be provided the memory address generator of the first aspect in combination with a processor, the processor configure to perform an algebraic operation based on values stored in the memory that are referenced by the current address and next address or addresses, and said processor comprises a programming unit configured to program the value stored in:
  each respective max-count register of one or more of the at least two counters;
  each count register of one or more of the at least two counters; and
  the candidate memory address increment value stored in each respective increment register of one or more of the plurality of increment registers,
  the processor further configured to provide signalling to cause the memory access generator to generate the next address output.

According to a second aspect there is provided the memory address generator of the first aspect, a processor and a memory, the memory comprising computer program code and configured to receive a multi-dimensional data structure, the execution of the computer program code by the processor configured to cause the processor to:
  provide the first address to the memory address generator and receive the next address therefrom;
  use the next address to address a next memory location which stores a value of the multi-dimensional data structure; and one of:
    retrieve a value from a multi-dimensional data structure stored in the memory; and
    store a value in a multi-dimensional data structure stored in the memory.

According to a third aspect there is provided a method of generating an address of a location in memory, the method comprising:
  receiving a first address comprising a location in the memory being accessed during a first memory access cycle;
  outputting a next address comprising a location in the memory to be accessed during a subsequent memory access cycle based on the current address and a memory address increment value output by an address increment unit:
  wherein the address increment unit comprises:
    at least a first counters, each counter comprising an input, an output, a count register and a max-count register, the method further comprising, for each counter:
    storing, in the count register, a count value;
    incrementing the count value in the count register each time an increment signal is received at the input up to the maximum value that is specified in the max-count register,
    when the count value reaches the maximum value, resetting the count register to a start value and providing an output signal at the output indicative of the maximum value being reached,
    providing the output signal of each of the at least one counters to a selector arrangement, the selector arrangement comprising at least a first increment registers configured to store a candidate memory address increment value; and
  selecting one of the at least one increment registers based on the output signals from at least one of the at least one counters of the counter arrangement to provide the candidate memory address increment value stored therein as the memory address increment value output by the address increment unit.

In one or more embodiments, there may be provided:
  at least two counters, the at least two counters comprising the first counter and at least a second counter, the at least two counters arranged in series in a chain such that the output signal of a first counter in the chain provides the increment signal to the input of an adjacent counter of the at least two counters in the chain and so on until a final counter of the at least two counters in the chain, and wherein the counter arrangement is configured to provide the output signal of the at least two counters to the selector arrangement;
  wherein the selector arrangement comprises a plurality of increment registers, including the first increment register, each increment register configured to store a candidate memory address increment value and the method may further comprise:
  selecting an increment register of the plurality of increment registers based on the receipt of one or more counter output signals from the counter arrangement to provide one or more of the candidate memory address increment values stored therein as the memory address increment value output by the address increment unit.

In one or more embodiments, the method may comprise based on the receipt of user instructions, resetting the two or more count registers to the start value.

In one or more embodiments, the method may further comprise:
  receiving user generated instructions at a programming unit that are executed by the programming unit to set the maximum value of the max-count register of each counter and the candidate increment values of each of the increment registers;

receiving user generated instructions at the programming unit that are executed by the programming unit to set the value stored in each count register of one or more of the at least two counters; and receiving user generated instructions representative of at least a single FOR loop and using said instructions and said variables to step through multiple dimensions of the multi-dimensional data structure.

According to a fourth aspect there may be provided a method for performing an algebraic operation comprising performing the method for addressing a multi-dimensional data structure of the third aspect and further performing an arithmetic computation and subsequently repeating the method for addressing a multi-dimensional data structure of the third aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
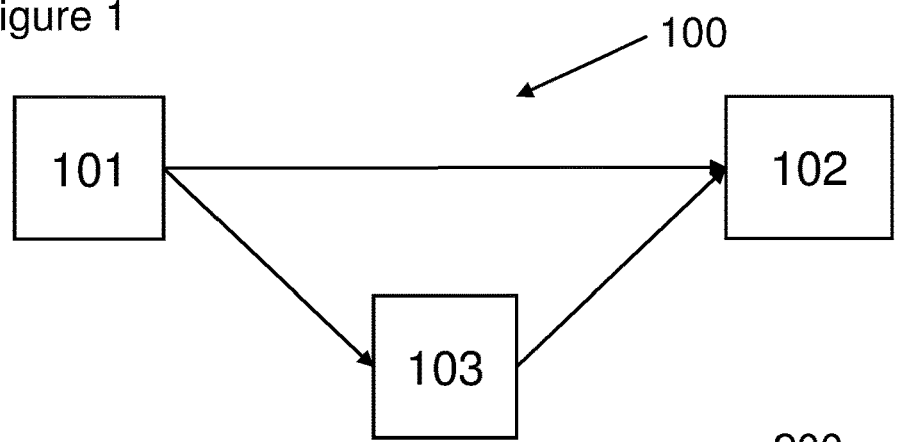
FIG. 1 shows an example embodiment of a computing system comprising a processor, a memory and a memory address generator.

FIG. 1 shows an example of a computing system 100 comprising a processor 101, a memory 102 and a memory address generator 103 wherein each of these comprises a hardware component of the computing system 100. In some instances, a processor 101 may perform read or write operations directly to the memory. On other occasions, as provided for in this disclosure, the processor 101 may make use of a hardware implemented memory address generator 103 to generate addresses for locations in the memory 102 to perform operations. This may particularly be the case when addressing a multi-dimensional data structure stored in the memory 102 and, for example, using the data stored at the memory address locations of the data structure for algebraic operations such as, but not limited to, tensor products, one-dimensional, two-dimensional, three-dimensional or higher-order convolutions, MaxPool, AveragePool or FullyConnected operations.

Multi-dimensional data structures are often represented as a matrix or tensor having more than two dimensions. In order to iterate through such structures, or portions of such structures, software instructions comprising nested FOR loops are often used with each FOR loop defining the portion of one dimension of the data structure to step through. In practice, the data values of a multi-dimensional data structure are normally stored in contiguous memory locations in the memory 102. These data values may be stored in row-wise contiguous locations in the memory. Alternatively, the data values may be stored in column-wise contiguous locations in the memory. Challenges may arise in traditional nested FOR loop implementations for addressing a multi-dimensional data structure when moving from a memory which stores a data structure row-wise to a memory which stores the data structure column-wise, as the nested FOR loop would need to be completely rewritten.

Figure 2:
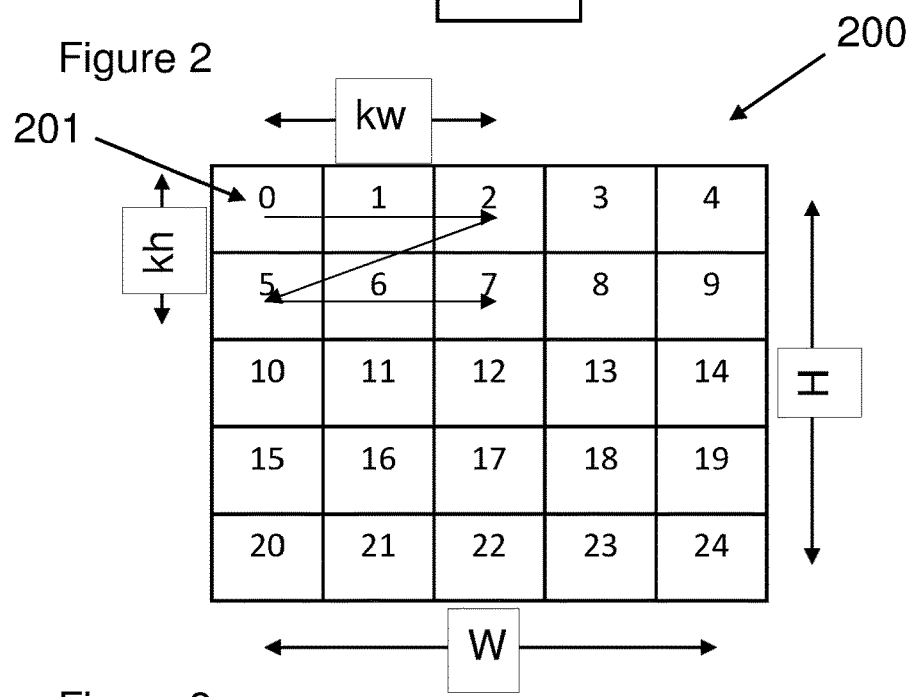
FIG. 2 shows an example of a multi-dimensional data structure and accessed using a first memory access pattern.

FIG. 2 shows an example of a multi-dimensional data structure 200. More specifically, in the example of FIG. 2, there is shown a two-dimensional data structure 200, however, it will be appreciated that such a data-structure may comprise any number of dimensions greater than or equal to two. A two-dimensional data structure may be referred to as a matrix or array while higher order data structures may be referred to as an array of arrays. A three dimensional data structure, for example, may be comprised of a plurality of two-dimensional arrays 200 such as that shown in FIG. 2, with each two-dimensional array 200 forming a slice of the three dimensional data structure. The values 0 to 24 in each of the cells of the array may represent the memory address locations at which the data values of the data structure are stored. Accordingly, the array, in this example, is stored in row-wise contiguous memory address locations.

In the example data structure of FIG. 2, the data structure 200 comprises five rows and five columns. Conventionally, in the event of a processor attempting to access a sub-portion 201 of the data structure 200, the processor may be configured to execute a nested FOR loop such as the following, where a simplified pseudo-code is provided on the left and comments between hashes are provided on the right to explain each line of code:

| | |
|---|---|
| addr = 0; | # Setting the initial memory address # |
| for h_idx = 0 : (kh−1) | # Setting a loop to increment through each position down a column from 0 to a target position, kh−1 # |
| for w_idx = 0 : (kw−1) | # Setting a loop to increment through each position along a row from 0 to a target position, kw−1 # |
| data_addr = addr + h_idx * W + w_idx; | # The data address is defined as the initial address plus the current value of w_idx plus the multiplication of the current value h_idx by the total width of the data structure# |
| load data_reg, [data_addr]+0; | # Data is loaded using the load function at the memory location of [data_addr] # |

Where kw is equal to the total number of columns in the subset 201 of the data structure 200 and kh is the total number of rows in the subset 201 of the data structure 200. It will be appreciated that the above represents one method of implementing a nested FOR loop in pseudo code, however, other codes may be used. It will further be appreciated that for each additional dimension of the multi-dimensional data structure 200 beyond the two shown, an additional nested FOR loop will be required to step through values of the data structure 200.

Using the above-described method, for each increment of the FOR loop, w_idx increments by one between 0 and kw−1 (0 and 2 in the case of FIG. 2) after which h_idx is incremented by one and w_idx is reset to zero. The process is then repeated until each value of interest in the sub-portion 201 of the data structure 200 has been addressed and the operation (in this case, a load operation) has been executed.

The approach of the above-descried method, however, may have drawbacks. The software overhead required for such nested FOR loop is high, meaning that a processor running the method may need to use a large number of available resources and may operate slowly. This may particularly be the case for multi-dimensional data structures having 3, 5, 10 or more dimensions. Pipeline systems (software or hardware pipeline systems) may be predisposed to programming efficiency problems when complex data processing instruction (such as adding, multiplying or subtracting) patterns meet complex data access instruction (such as load or store instructions) patterns. The features of this disclosure may result in a reduction of the impact of these pipeline efficiency problems by simplifying the data access operations.

Figure 3:
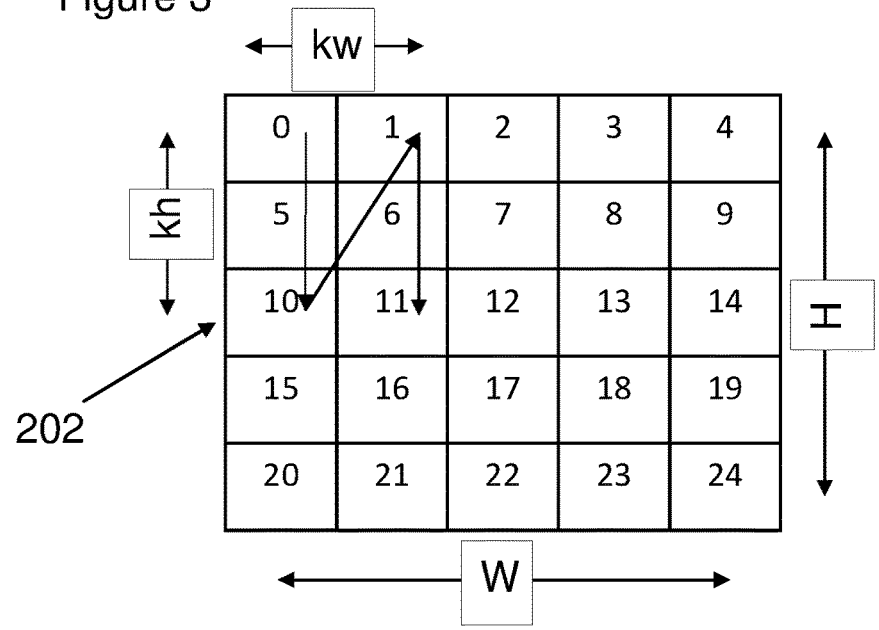
FIG. 3 shows the example multi-dimensional data structure accessed using a different memory access pattern.

FIG. 3 shows a second example of a multi-dimensional data structure 200. In the example of FIG. 3, it is desired to access the sub-portion 202 of the data structure 200 comprising the transpose of the sub-portion 201 of FIG. 2, i.e. first two columns of the data structure and the first three rows. In order to achieve the desired path through the data structure using a nested FOR loop implementation, it would be necessary to re-write the code provided above to change which loop is nested inside the other. This highlights the inflexibility of a nested FOR loop implementation.

According to one or more embodiments of the present disclosure there is described a memory address generator 103 which, in one or more examples, may address some or all of the disadvantages of using a nested FOR loop implementation to obtain memory addresses for a multi-dimensional data structure 200 as describe above.

Figure 4:
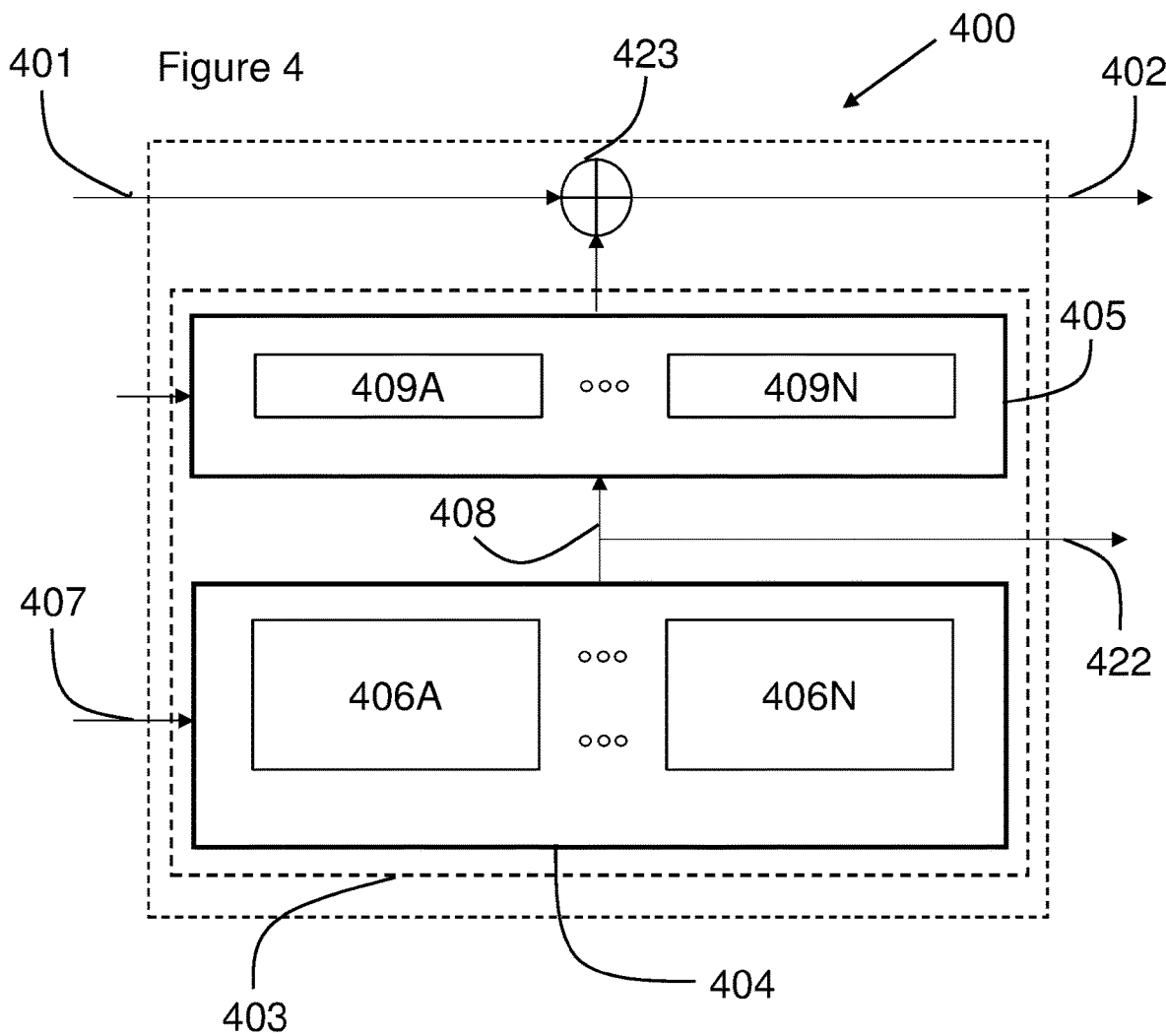
FIG. 4 shows an example embodiment of a memory address generator.

FIG. 4 shows an example of a memory address generator 400 which is configured to receive, at a first address input 401, a location in the memory being accessed during a first memory access cycle and subsequently output, at a next address output 402, a next address comprising a location in the memory to be accessed during a subsequent memory access cycle based on the current address and a memory address increment value output by an address increment unit 403. In some embodiments, the increment value may be added to the location in the memory accessed during a first memory access cycle by an adder 423 in order to provide the next address. In other examples other logic functions other than an adder could be used such as a subtractor, multiplier or any other logical function. It will be appreciated that "accessing" a location in memory may comprise any relevant operation such as reading the value at that memory location or writing a value to that memory location. While the first address input 401 is described as receiving a "first" address, it will be appreciated that during the process of incrementing through memory locations in the multi-dimensional data structure, the first address input 401 will receive, in this example, the address of the most recently addressed location to which the memory address increment value can be added.

With reference to FIGS. 2 and 3, the first address increment accessed in these instances is address location 0. It will be appreciated that, in fact, the address in memory where the multi-dimensional data structure 200 is stored may be at any location in the data structure and so could comprise any value. In addition, a sub-portion of interest of the multi-dimensional data structure may not include the first entry in the data structure and, as such, the value of the first address may comprise an address corresponding, for example, to address location 12 of the data structure 200. Thus, by defining the first address value, control may easily be provided over those sub-portions of the multi-dimensional data structure which are to be addressed.

The example memory address increment unit 403 comprises a counter arrangement 404 and a selector arrangement 405; each of these will be described in more detail with reference to FIGS. 5 and 6. The counter arrangement 404 comprises at least one counter 406A-406N and, based on an increment signal received by the counter arrangement at an increment signal input 407 and a maximum value for each counter, the counter arrangement 404 is configured to provide at least one counter output signal 408 to the selector arrangement 405. Each counter output signal 408 may corresponds to an output from a particular counter 406 in the counter arrangement. The selector arrangement 405 comprises at least one candidate memory address increment value stored in at least a first, respective, increment register 409A-409N. The selector arrangement 405 is configured to receive the one or more output signals from the counters 406 of the counter arrangement 404 and, based on those output signals 408, provide one of the candidate memory address increment values as the address increment value.

The counters 406 of the counter arrangement 404 and the increment registers 409 of the selector arrangement 405 may comprise hardware implementations. The counter arrangement 404 and the selector arrangement 405 may be configurable by virtue of software instructions and, in this way, a processor may execute computer software instructions to cause the memory address generator 400 to provide an address increment value utilising only a single increment signal provided to the counter arrangement 404 and the configured components of the memory address increment unit 403.

The software instructions required to implement the addressing of a sub-portion of the multi-dimensional data structure may only require a single FOR loop in order to implement the addressing of an N-dimensional data structure where N is any integer value equal or greater than 2. As such, the use of the memory address generator 400 may remove computationally costly overheads associated with nested FOR loops. The memory address generator 400 may also obviate the need for the cumbersome rewriting of nested FOR loops in order to address different portions of a multi-dimensional data structure. Instead, read, write and even complex algebraic operations may be performed using only the initial definition of a set of registers of the memory address generator 400 as described in further detail below.

In one or more embodiments, there may be provided a limited number of hardware counters 406, such as three, four or five counters. Where the number of available hardware counters 406 is smaller than N−1, where N is the number of dimensions in the dataset, software instructions may need to include more than a single FOR loop to address any location in the multi-dimensional data structure. As such, in one or more embodiments, each counter 406 of the counter arrangement 404 may replace one FOR loop in software instructions and, where necessary, the software instructions may contain two or more FOR loops in order to implement the addressing of an N-dimensional data structure. In any scenario, according to the present disclosure, the number of FOR loops of the user generated instructions is fewer than the number of dimensions of the multi-dimensional data structure.

In some embodiments, the output 408 of the counter arrangement 404 may comprise a tap output 422 configured to provide the one or more output signals of the one or more counters 406A-406N. The provision of the output signals of the counter arrangement may allow for a plurality of additional functionalities. For example, the output signals may allow for additional software to perform actions when a certain one or more of the count registers reaches its respective maximum value. This may allow for certain actions to be taken when each row or each column is completed. In some systems where a CACHE is used between the CPU and RAM, the cache could be informed through output signals from the tap output 422 about the memory access pattern so that it can prefetch the data in advance. This may reduce memory latency by reducing the cache miss rate.

Figure 5:
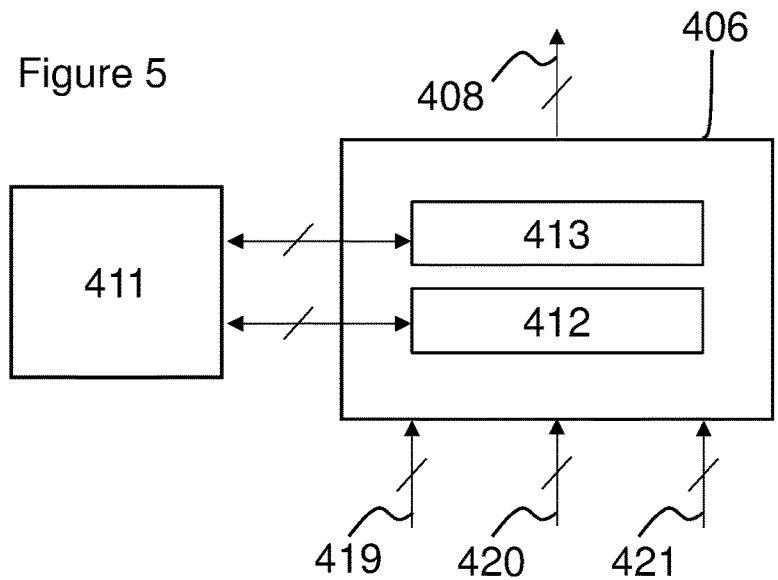
FIG. 5 shows an example embodiment of a counter and associated programming unit.

FIG. 5 shows an example embodiment of a single counter 406 of the counter arrangement 404 coupled to a programming unit 411. The counter 406 comprises a count register 412 which is configured to store a value and increase the value stored therein each time an input signal is received. The counter further comprises a max-count register 413 which is configured to receive and store a maximum value. When the value in the count register 412 of a given counter 406 reaches the maximum value of the max-count register 413, the count register 412 is configured to provide a counter output signal at its output 408. In some examples, the output signal will be provided during the cycle following the memory access cycle when the value stored in the count register 412 reaches the maximum value, i.e. when the value stored in the count register 412 would exceed the maximum value. In addition, when the value of the count register 412 of a given counter 506 reaches the maximum value of the max-count register 413, the count register 412 may be configured to reset the value stored in the count register 412 to a start value, such as zero. In some examples, the value stored in the count register 412 will be reset to the start value during the memory access cycle following the memory access cycle when the value stored in the count register 412 reaches the maximum value, i.e. when the value stored in the count register 412 would otherwise exceed the maximum value stored in the max-count register 413.

It will be appreciated that, in other example embodiments, equivalently, the value stored in the count register 412 may be configured to not reset to a start value when the value stored in the count register 412 equals the maximum value, but rather the count register 412 may be configured to provide an output signal whenever the value stored in the count register 412 is a multiple of the maximum value.

Both the count register 412 and the max-count register 413 may be programmable by the programming unit 411 of the memory address generator. The programming unit 411 may be configured to receive user generated instructions and, based on those instructions, provide an output to one or both of the count register 412 and the max-count register 413 of one or more of the counters 406 in order to set the values thereof. It will be appreciated that in other examples, the values of one or more of the count registers 412 and max-count registers 413 may be, in part, fixed, non-programmable values. The programming unit 411 may further be configured to set the values of the count registers 412 of one or more of the counters to a default value at the initiation or at the end of a memory access operation during which memory addresses are generated for a plurality of locations in memory. This may ensure that the count registers 412 are at the desired start-values prior to a subsequent memory access operation and thereby obviate the need for a user to manually define start-values of the count registers 412.

By programming the maximum value of the max-count register 413, the number of increments before the count register 412 provides an output signal to the selector arrangement 405 is adjusted. This may be considered a hardware-implemented equivalent of setting the value of kw in the nested FOR loop provided above.

By programming the count register 412, the number of increments before the first output signals is output by the counter 406 can be controlled, thereby providing further control for the portion of the data array which is addressed. This may provide an additional way to enable further flexibility to the memory address generator beyond that simply available to a nested FOR loop. This may, for example, provide functionality which could only be defined by a FOR loop implemented as FOR kw=0, 1, 4, which may be more complex.

The counter may comprise an enable input 419. The counter 406 may be configured to be inactive if no signal is received at the enable input 419, and only to allow for changes to the value stored in the count register 412 if a signal is received at the enable input 419.

The counter 406 may comprise a counter increment input 420 wherein the counter 406 is configured to increase the value stored in the count register 412 when a signal is received at the counter increment input 420. In the first counter 406 of the counter arrangement 404, the counter increment input 420 may be the increment signal input 407 of the counter arrangement. Where there is a plurality of counters, the counter increment input 420 may be coupled to the output of the previous counter in the plurality of counters.

The counter 406 may comprise a reset input 421 wherein the counter 406 is configured to set the value stored in the count register 412 to a reset value, such as zero, when a signal is received at the reset input 421. In some embodiments, the reset input 421 may not be necessary at all and the programming unit 411 may be used to explicitly write the value of the count register 412 to a start value.

Figure 6:
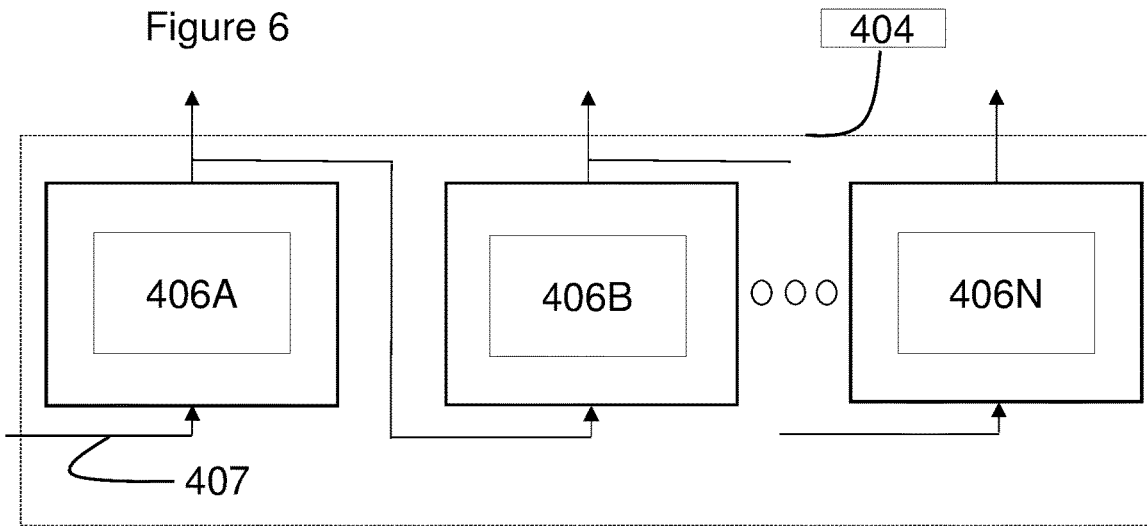
FIG. 6 shows an example embodiment of a plurality of counters arranged in a series chain.

FIG. 6 shows an example embodiment of the counter arrangement 404 comprising a plurality of counters 406A, 406B . . . 406N in a cascaded arrangement. It will be appreciated that any number of counters 406 may be provided in the counter arrangement 404 such as at least one, two, three, four, nine or more counters 406. The counters 406 in this cascaded counter arrangement 404 are arranged in series in a chain such that the output signal of the first counter 406A is provided as the input increment signal to the second counter 406B. Correspondingly, the output signal of the second counter 406B is provided to the input of the third counter, if one is present, and so on until the final counter 406N in the chain, which may be referred to as the Nth counter. Each of the counters 406 comprises a count register and max-count register as previously described with reference to the counter of FIG. 5. The first counter 406A of the cascaded counter arrangement 404 receives at its input the input increment signal provided to the counter arrangement at the increment signal input 407. In some embodiments, the input signal to the counter arrangement may be provided by the processor during each memory access cycle.

The count register of the first counter 406A in the cascaded counter arrangement 404 may increase in value by a predetermined amount, such as incremented by one, during each memory access cycle during which an input signal is received by the counter arrangement 404. The count register of the second counter 406B will be incremented each time the first counter 406A provides an output signal, that is, each time the value stored in the count register reaches the maximum value stored in the max-value count register of the first counter 406A. The second counter 406B will then provide an output signal when the value in its count register reaches the maximum-value stored in the max-value count register of the second counter 406B. When the second counter 406B provides an output signal, the count register of the third counter will be incremented and so on until the Nth counter 406N, i.e., the final counter in the chain. By way of this structure, the counter arrangement 404 may provide a hardware implementation to mimic the functionality of incrementing through two or more nested FOR loops.

Figure 7:
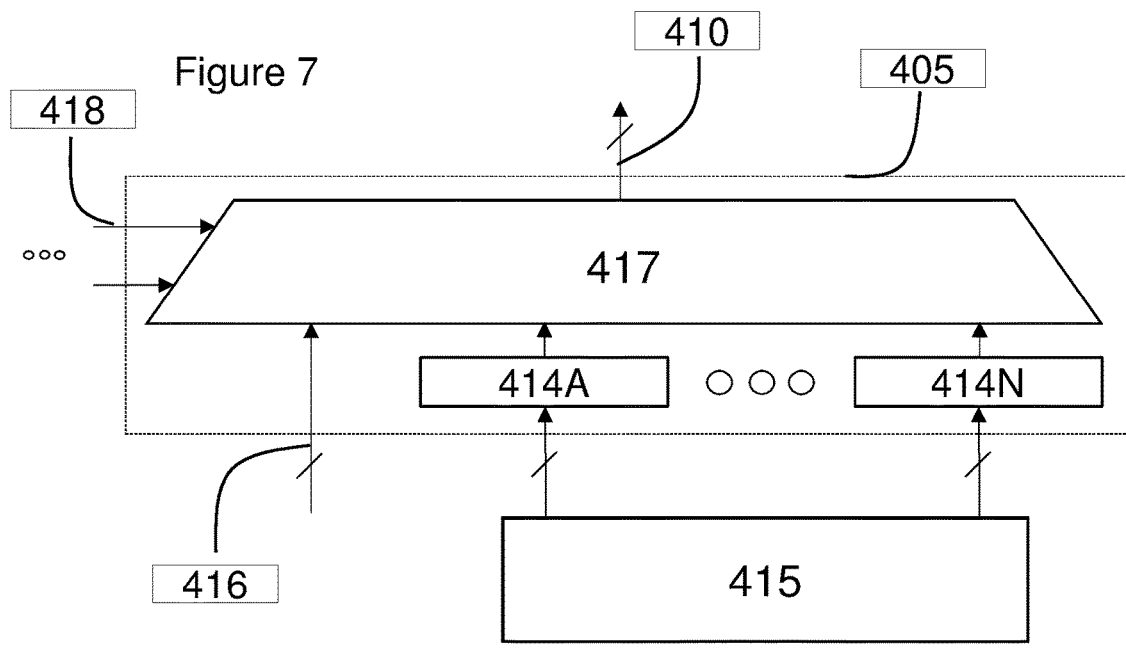
FIG. 7 shows an example embodiment of a selector arrangement.

FIG. 7 shows an example embodiment of the selector arrangement 405. The selector arrangement 405 comprises one or more increment registers 414 each configured to store a candidate memory address increment value. The increment registers 414 may be programmable by a programming unit 415. The programming unit 415 may be configured to receive user generated instructions which cause the programming unit 415 to set the values in the increment registers 414. The programming unit 415 which programs the increment registers 415 may be the same programming unit 411 that programs the count registers 412 and max-value count registers 413 of the counter arrangement 404. Alternatively, the increment register programming units 415 and the count register programming unit 411 may be different programming units. Thus, the programming units may receive instructions from software and, based on those instructions, program the registers of the memory address generator 400.

Each of the increment registers 414A-414N is associated with a corresponding counter 406 of the counter arrangement 404 such that when the selector arrangement 405 receives an output signal from a counter 406 of the counter arrangement 404, selector arrangement 405 is configured to provide the candidate memory address increment value of the associated increment register 414 as the memory address increment. The selector arrangement 405 also comprises a default increment register configured to store a default increment value. If, during a given memory access cycle, no output signal is received from the counter arrangement 404 because no count register reached the maximum value of the corresponding max-count registers (or in some embodiments, no count register would have exceeded the maximum value of its corresponding max-value count register), the selector arrangement is configured to provide the default increment value as the memory address increment at output 410.

As a result of the configuration of the counter arrangement 404 and the selector arrangement 405, the increment selector unit 403 provides a memory address increment each memory access cycle, regardless of whether an output signal is received from the counter arrangement or not. In one or more embodiments, it may not be necessary to have a default increment register because the desired default increment may be zero. In other examples, a default increment value may be defined based on user generated instructions to be executed by the processor and may be provided to the selector arrangement 405 during each memory access cycle at a default increment value input 416. The default increment register may be a programmable register so that a programming unit may set the default increment value based on software instructions or user generated instructions.

It will be appreciated that the count registers, max-value count registers, default increment register and increment registers may be any type of memory that can store a value such as dedicated hardware registers.

It will be appreciated that the selector arrangement 405 may receive output signals from more than one counter 406A-406N in a single memory access cycle. Thus, the selector arrangement 405 may be configured to operate accordingly to a rule, such that one candidate memory address increment value (or the default increment value) is selected in each memory access cycle as the memory address increment value output. In some embodiments, the first counter 406A in the counter arrangement chain may be considered to provide an output signal having a first order. Each subsequent counter in the chain may be considered to provide an output signal of a monotonically increasing order up to the final counter 406N in the chain of counters 406A-406N. During a given memory access cycle, upon the receipt of a plurality of output signals from two or more of the counters 406-406N, the selector arrangement 405 may be configured to provide a memory address increment based on the highest order output signal of the plurality of output signals. This provides a mode of operation which ensures only a single increment value is provided at the output of the selector arrangement 405 during each duty cycle and defines an ordered hierarchy to control which candidate memory address increment value takes precedence. It will be appreciated that the order of the signals described above is for illustrative purposes in order to help define which signal takes precedence and does not necessarily imply that there is a fundamental difference between the signals but rather that the selector arrangement 405 is configured to have a predetermined hierarchy associated with the output signals received from the counters 406 and/or the increment registers 414 in order to determine which candidate increment value should be provided as the memory address increment value in the case of the receipt of multiple output signals from the counter arrangement 404. It will be appreciated that, while the order of the output signals from the counters 406 has been described as monotonically increasing, any approach may be employed to define a method of hierarchy.

In one or more embodiments, the selector arrangement may comprise a multiplexer 417. The one or more increment registers 414A-414N may provide one or more candidate input values. The default increment value may also be provided to the multiplexer 417 as a candidate input value. The output values from the counters 406 of the counter arrangement 404 may be provided to the select lines 418 of the multiplexer 417 in order to determine which candidate increment values to provide as the memory address increment value.

By providing a counter arrangement 404 and selector arrangement 405 as described above, the output signal of each counter 406 may be compared to one loop in a nested FOR loop being completed. As such, each time the counter arrangement 404 does not provide an output signal and, instead, the default increment value is used as the memory address increment value, it is as if the inner FOR loop of a nested FOR loop is being implemented but not completed. Each time the first counter 406A provides an output signal, it is as if the innermost nested FOR loop has completed and caused the next outer-most FOR loop to increment by one and so on.

Thus, in order to replicate the functionality of a nested FOR loop to iterate through a multi-dimensional data structure 200 as shown in FIG. 2, the user generated instructions (pseudo code) executed by the processor may resemble the following:

| | |
|---|---|
| clr.auto; | # Clear programmable registers # |
| set.incr_reg0,W−kw+1; | # Set candidate increment value to 3 # |
| set.wrap_reg0,kw−1; | # Set maximum value of max-value count register to 2 # |
| incr_reg = 1; | # Set default increment value to 1 # |
| addr = 0; | # Set first address input as 0 # |
| for idx = 1 : kw * kh | # A single FOR loop to run through all of the desired memory locations # |
| load.auto data_reg,[addr]+incr_reg; | # Cause the processor to address the data structure using an increment equal to the current address plus the default increment value # |

Thus, it can be seen that a single FOR loop, the processor or programming unit may be instructed to define a plurality of variables for said registers 414A-414N, 412, 413 to implement a nested FOR loop for incrementing through a multi-dimensional data structure having any number of dimensions. Instead of adding computationally expensive additional FOR loops, the software or user only needs to define additional candidate increment values and maximum values during initialisation of the user generated instructions.

Using a memory address generator 403 as described above, it may also be less complex to alter the user generated instructions to address the transpose of a previously addressed data structure, such as moving from addressing the sub-portion of FIG. 2 to the sub-portion of FIG. 3. This may be particularly useful for performing algebraic operations, such as matrix multiplication or other operations.

In one or more embodiments the processor may be configured to address the first desired location in memory directly and then to use the memory address generator 400 for the generation of each subsequent memory address.

Figure 8:
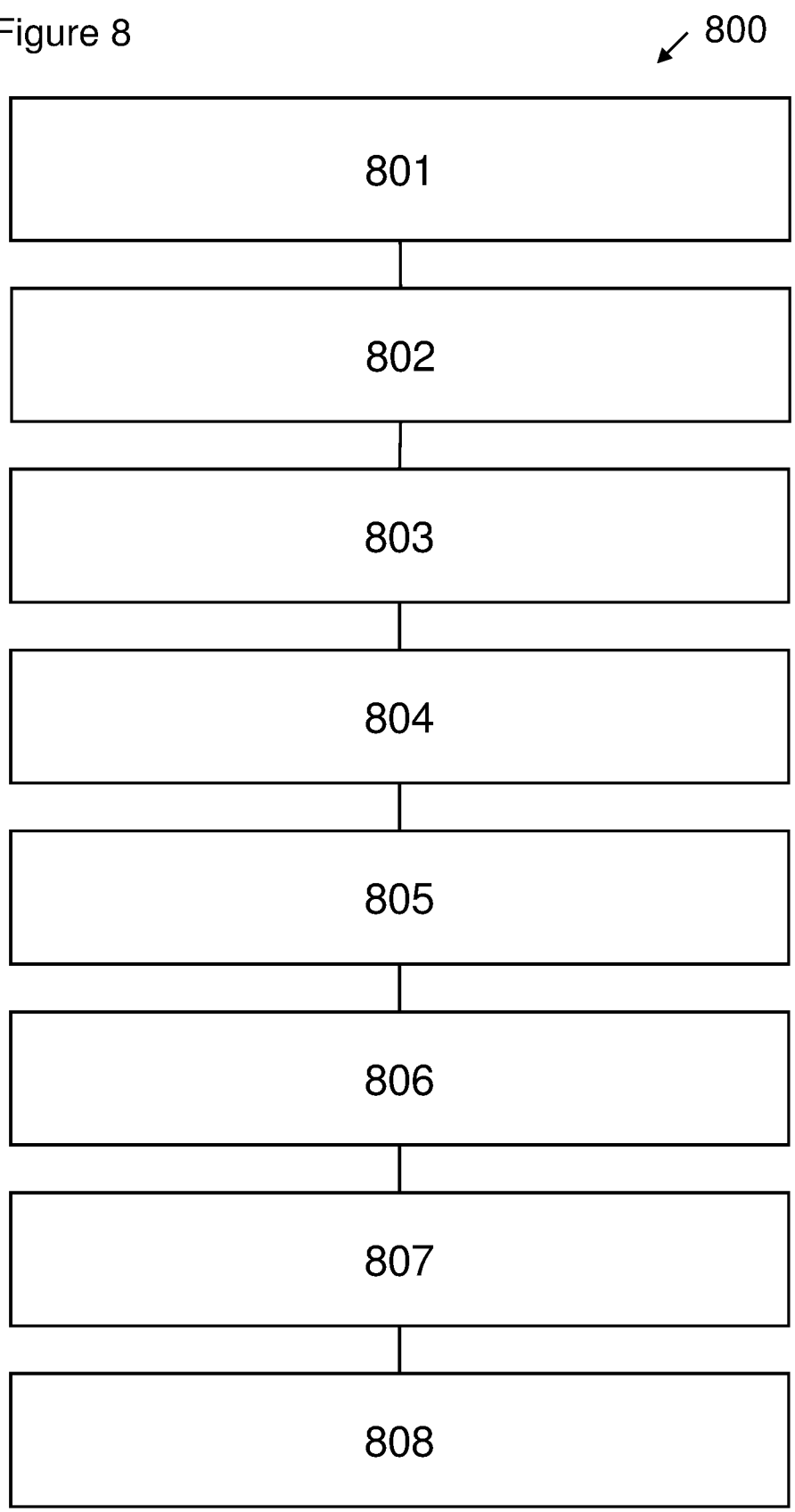
FIG. 8 shows an example embodiment of a method of generating an address of a location in memory.

FIG. 8 shows an example method 800 of generating an address of a location in memory. The method comprises receiving 801 a first address comprising a location in the memory being accessed during a first memory access cycle. The method further comprises outputting 802 a next address comprising a location in the memory to be accessed during a subsequent memory access cycle based on the current address and a memory address increment value output by an address increment unit. The address increment unit comprises at least a first counter, each of the at least first counter comprising an input, an output, a count register and a max-count register. The method further comprises, for each counter, storing 803, in the count register, a count value; and incrementing 804 the count value in the count register each time an increment signal is received at the input up to the maximum count value that is specified in the count register. The method also comprises, when the count value reaches the maximum value, resetting 805 the count register to a start value and providing 806 an output signal at the output indicative of the maximum value being reached; providing 807 the output signal of each of the at least one counter to a selector arrangement. The selector arrangement comprises at least a first increment register configured to store a candidate memory address increment value. The method further comprises selecting 808 one of the at least one increment registers based on the output signals from the at least one counter of the counter arrangement to provide the memory address increment value stored therein as the memory address increment value output by the address increment unit.

The method may further comprise selecting an increment register of a plurality of increment registers based on the receipt of one or more counter output signals from the counter arrangement to provide one or more of the candidate memory address increment values stored therein as the memory address increment value output by the address increment unit. The method may further comprise providing a default memory address increment value as the memory address increment value in the absence of an output signal from any of the at least one counters.

The method may comprise receiving user generated instructions at a programming unit that are executed by the programming unit to set the maximum value of the max-count register of the or each counter and the or each candidate increment values of the or each of the increment registers; receiving user generated instructions at the programming unit that are executed by the programming unit to set the value stored in each count register of one or more of the at least one counters; and receiving user generated instructions representative of a single FOR loop and using said instructions and said variables to step through multiple dimensions of the multi-dimensional data structure.

A method is provided of performing an algebraic operation comprising performing the method for addressing a multi-dimensional data structure as shown in FIG. 8, subsequently performing an arithmetic computation and subsequently repeating the method for addressing a multi-dimensional data structure as shown in FIG. 8. In this way, for example, a matrix multiplication operation may be performed where all, or a sub-portion, of the two-dimensional matrix are addressed for a read operation incrementing along the rows of the matrix followed by the columns, as shown in FIG. 2. Then all of, or a sub-portion, of a second two-dimensional matrix may be addressed for a read operation incrementing down the columns followed by the rows, as shown in FIG. 3. Once the entries from each two-dimensional data structure have been read in the correct order, a matrix multiplication can be carried out using the standard approach. It will be appreciated that, in this case, the user generated instructions may use the same code for executing the loop for addressing each matrix with only differently initialised values. This may provide a particularly advantageous and simple approach which avoids computationally expensive overheads.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A memory address generator for generating an address of a location in a memory, the memory address generator comprising:
   a first address input for receiving a first address comprising a location in the memory being accessed during a first memory access cycle;
   a next address output configured to output a next address comprising a different location in the memory to be accessed during a subsequent memory access cycle based on a current address and a memory address increment value output by an address increment unit, wherein the current address corresponds to the first address;
   wherein the address increment unit comprises:
      a counter arrangement comprising one or more counters, including at least a first counter, each counter having an input, an output, a count register and a max-count register, wherein each counter is configured to store a count value in the count register that is incremented each time an increment signal is received at the input up to maximum value that is specified in the max-count register, and wherein each counter is configured to, when the count value reaches the maximum value, reset the count register to a start value and provide an output signal at the output indicative of the maximum value being reached; and
      a selector arrangement, wherein the selector arrangement comprises one or more increment registers, including at least a first increment register, each increment register configured to store a candidate memory address increment value, and wherein the selector arrangement is configured to:
         select one of the one or more increment registers based on the receipt of the output signal from a corresponding counter of the counter arrangement to provide the candidate memory address increment value stored therein as the memory address increment value output by the address increment unit; and
         provide, based on the absence of an output signal from any counter of the one or more counters, a default memory address increment value as the memory address increment value output by the address increment unit.

2. A memory address generator according to claim 1 wherein the counter arrangement comprises at least two counters, the at least two counters comprising the first counter and at least a second counter, the at least two counters arranged in series in a chain such that the output signal of the first counter of the at least two counters in the chain provides the increment signal to the input of an adjacent counter of the at least two counters in the chain and so on until a final counter of the at least two counters in the chain, and wherein the counter arrangement is configured to provide the output signal of each of the at least two counters to the selector arrangement,
wherein the selector arrangement comprises a plurality of increment registers, including the first increment register, each increment register of the plurality of increment registers configured to store a candidate memory address increment value and wherein the selector arrangement is configured to select an increment register of the plurality of increment registers based on the receipt of one or more counter output signals from the counter arrangement to provide one of the candidate memory address increment values stored therein as the memory address increment value output by the address increment unit.

3. A memory address generator according to claim 1, wherein the memory address generator includes a programming unit configured to receive user instructions to set at least one of:
   the maximum value stored in each respective max-count register of the one or more counters;
   the count value stored in each respective count register of the one or more counters; and
   the candidate memory address increment value stored in each respective increment register of the one or more increment registers;
to define a custom pattern of locations in the memory to be accessed over a plurality of memory access cycles.

4. A memory address generator according to claim 2, wherein the first counter in the chain may be configured to receive an input signal from a processor, wherein the processor is operable to control the memory access cycles.

5. A memory address generator of claim 1 in combination with said memory, said memory configured to store a multi-dimensional data structure for use in an algebraic operation, wherein values of the multi-dimensional data structure are stored at respective locations in said memory that are identified by said current address and said next address and wherein the memory address generator is configured to receive at least one of one or more of the maximum values or one or more of the candidate memory address increment values and then generate one or more next addresses for accessing the values of the multi-dimensional data structure to perform said algebraic operation.

6. A memory address generator of any of claim 3 wherein the programming unit is configured to reset the count registers of the one or more counters to the start value based on received user generated instructions.

7. A memory address generator of any of claims 2 wherein:
- each of the counters of the at least two counters corresponds to a different one of the plurality of increment registers;
- the first counter in the chain of counters provides an output of a first order and each subsequent counter in the chain of counters provides an output signal of a monotonically increasing order up to the final counter in the chain of counters;
- wherein, during a given access cycle, upon receipt of a plurality of output signals from the at least two counters, the selector arrangement is configured to provide a memory address increment based on the highest order output signal of the plurality of output signals.

8. A memory address generator of claim 1 in combination with a processor, the processor configured to perform an algebraic operation based on values stored in the memory that are referenced by the current address and next address or addresses, and said processor comprises a programming unit configured to program a value stored in:
- each respective max-count register of the one or more counters;
- each count register of the one or more counters; and
- each respective increment register of the one or more increment registers, the processor further configured to provide signalling to cause the memory address generator to generate the next address output.

9. A computing system comprising the memory address generator of claim 1, a processor and a memory, the memory comprising computer program code and configured to receive a multi-dimensional data structure, the execution of the computer program code by the processor configured to cause the processor to:
- provide the first address to the memory address generator and receive the next address therefrom;
- use the next address to address a next memory location which stores a value of the multi-dimensional data structure; and one of:
- retrieve a value from a multi-dimensional data structure stored in the memory; and
- store a value in a multi-dimensional data structure stored in the memory.

10. A method of generating an address of a location in memory, the method comprising:
- receiving a first address comprising a location in the memory being accessed during a first memory access cycle;
- outputting a next address comprising a different location in the memory to be accessed during a subsequent memory access cycle based on a current address and a memory address increment value output by an address increment unit, wherein the current address corresponds to the first address;
- wherein the address increment unit comprises:
  - at least a first counter, each counter of the at least the first counter comprising an input, an output, a count register and a max-count register,
  - the method further comprising, for each counter:
    - storing, in the count register, a count value,
    - incrementing the count value in the count register each time an increment signal is received at the input up to a maximum value that is specified in the max-count register,
    - when the count value reaches the maximum value, resetting the count register to a start value and providing an output signal at the output indicative of the maximum value being reached,
    - providing the output signal of each counter of the at least the first counter to a selector arrangement, the selector arrangement comprising at least a first increment register configured to store a candidate memory address increment value;
    - selecting one of the at least the first increment register based on the output signals from the at least the first counter to provide the candidate memory address increment value stored therein as a memory address increment value output by the address increment unit; and
    - providing a default memory address increment value as the memory address increment value output by the address increment unit in the absence of an output signal from any counter of the at least the first counter.

11. The method of claim 10:
wherein the an address increment unit comprises at least two counters, the at least two counters comprising the first counter and at least a second counter, the at least two counters arranged in series in a chain such that the output signal of the first counter in the chain provides the increment signal to the input of an adjacent counter of the at least two counters in the chain and so on until a final counter of the at least two counters in the chain, and wherein the method comprises providing, by the at least the first counter, the output signal of the at least two counters to the selector arrangement;
wherein the selector arrangement comprises a plurality of increment registers, including the first increment register, each increment register of the plurality of increment registers configured to store a corresponding candidate memory address increment value and the method further comprising:
- selecting an increment register of the plurality of increment registers based on receipt of one or more counter output signals from the at least the first counter to provide one or more of the candidate memory address increment values stored therein as the memory address increment value output by the address increment unit.

12. The method of claim 10, wherein said method comprises a method for addressing a multi-dimensional data structure and the method further comprising:
- receiving user generated instructions at a programming unit that are executed by the programming unit to set the maximum value of the max-count register of each counter and the candidate memory address increment value of each of the increment registers;

receiving user generated instructions at the programming unit that are executed by the programming unit to set the count value stored in the count register of each counter; and receiving user generated instructions representative of at least a single FOR loop and using said instructions and said variables to address multiple values of said multi-dimensional data structure over multiple dimensions of the multi-dimensional data structure.

13. A method of performing an algebraic operation comprising performing the method for addressing a multi-dimensional data structure of claim 12, performing an arithmetic computation and subsequently repeating the method for addressing a multi-dimensional data structure of claim 12.

14. A memory address generator of claim 1 further comprising an adder configured to add the memory address increment value to the first address and, on subsequent memory access cycles, configured to add the memory address increment value to each next address that was output on the immediately preceding memory access cycle.

15. The method of claim 12 further comprising resetting each of the count registers of the at least one count register to the start value based on received user generated instructions.

16. The method of claim 12 wherein the number of FOR loops of the received user generated instructions is fewer than the number of dimensions of the multi-dimensional data structure.

17. The method of claim 11 wherein each of the counters of the two or more counters corresponds to a different one of each of the plurality of increment registers;

the first counter in the chain of counters provides an output of a first order and each subsequent counter in the chain of counters provides an output signal of a monotonically increasing order up to the final counter in the chain of counters;

wherein the method further comprises, during a given access cycle, upon receipt of a plurality of output signals from the two or more counters, providing a memory address increment based on the highest order output signal of the plurality of output signals.

18. A method of accessing a multi-dimensional data structure comprising the method of claim 10 and further comprising:

providing the first address to the memory address generator and receive the next address therefrom;

using the next address to address a next memory location which stores a value of the multi-dimensional data structure; and one of:

retrieving a value from a multi-dimensional data structure stored in the memory; and storing a value in a multi-dimensional data structure stored in the memory.

* * * * *